United States Patent
Al-Bayati et al.

(10) Patent No.: US 7,166,524 B2
(45) Date of Patent: Jan. 23, 2007

(54) METHOD FOR ION IMPLANTING INSULATOR MATERIAL TO REDUCE DIELECTRIC CONSTANT

(75) Inventors: Amir Al-Bayati, San Jose, CA (US); Rick J. Roberts, San Jose, CA (US); Kenneth S. Collins, San Jose, CA (US); Ken MacWilliams, Portland, OR (US); Hiroji Hanawa, Sunnyvale, CA (US); Kartik Ramaswamy, San Jose, CA (US); Biagio Gallo, Palo Alto, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 11/003,000

(22) Filed: Dec. 1, 2004

(65) Prior Publication Data

US 2005/0191828 A1    Sep. 1, 2005

Related U.S. Application Data

(63) Continuation-in-part of application No. 10/838,052, filed on May 3, 2004, which is a continuation-in-part of application No. 10/786,410, filed on Feb. 24, 2004, now Pat. No. 6,893,907, which is a continuation-in-part of application No. 10/646,533, filed on Aug. 22, 2003, which is a continuation-in-part of application No. 10/164,327, filed on Jun. 5, 2002, now Pat. No. 6,939,434, which is a continuation-in-part of application No. 09/636,435, filed on Aug. 11, 2000, now Pat. No. 6,494,986.

(51) Int. Cl.
*H01L 21/425* (2006.01)

(52) U.S. Cl. ............ 438/530; 438/301; 438/367; 257/288

(58) Field of Classification Search ............ 438/301, 438/367, 530, 532; 257/288, 415, 417, 418
See application file for complete search history.

(56) References Cited

U.S. PATENT DOCUMENTS 2,344,138 A    3/1944    Drummond ............ 117/107

(Continued)

FOREIGN PATENT DOCUMENTS

EP    0 546 852 A1    6/1993

(Continued)

OTHER PUBLICATIONS

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

(Continued)

*Primary Examiner*—Phuc T. Dang
(74) *Attorney, Agent, or Firm*—Law Office of Robert M. Wallace

(57) ABSTRACT

An integrated microelectronic circuit has a multi-layer interconnect structure overlying the transistors consisting of stacked metal pattern layers and insulating layers separating adjacent ones of said metal pattern layers. Each of the insulating layers is a dielectric material with plural gas bubbles distributed within the volume of the dielectric material to reduce the dielectric constant of the material, the gas bubbles being formed by ion implantation of a gaseous species into the dielectric material.

38 Claims, 10 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,176,003 A | 11/1979 | Brower et al. | 430/313 |
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,579,618 A | 4/1986 | Celestino et al. | 156/345 |
| 4,584,026 A | 4/1986 | Wu et al. | 148/1.5 |
| 4,698,104 A | 10/1987 | Barker et al. | 437/141 |
| 4,764,394 A | 8/1988 | Conrad | 427/38 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,229,305 A | 7/1993 | Baker | 437/11 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,354,381 A | 10/1994 | Sheng | 118/723 |
| 5,423,945 A | 6/1995 | Marks et al. | 156/662.1 |
| 5,435,881 A | 7/1995 | Ogle | 156/345 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,770,982 A | 6/1998 | Moore | 333/32 |
| 5,885,358 A | 3/1999 | Maydan et al. | 118/723 |
| 5,888,413 A | 3/1999 | Okumura et al. | 216/68 |
| 5,897,713 A | 4/1999 | Tomioka et al. | 118/723 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,958,140 A | 9/1999 | Arami et al. | 118/725 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,041,735 A | 3/2000 | Murzin et al. | 118/723 |
| 6,050,218 A | 4/2000 | Chen et al. | 118/723 |
| 6,076,483 A | 6/2000 | Shintani et al. | 118/723 |
| 6,096,661 A | 8/2000 | Ngo et al. | 438/788 |
| 6,101,971 A | 8/2000 | Denholm et al. | 118/723 E |
| 6,103,599 A | 8/2000 | Henley et al. | 438/459 |
| 6,121,161 A | 9/2000 | Rossman et al. | 438/783 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,180,496 B1 | 1/2001 | Farrens et al. | 438/455 |
| 6,182,604 B1 | 2/2001 | Goeckner et al. | 118/723 |
| 6,187,110 B1 | 2/2001 | Henley et al. | 148/33.2 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Nishida | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanawa et al. | 156/345 |
| 6,350,697 B1 | 2/2002 | Richardson et al. | 438/710 |
| 6,375,790 B1 | 4/2002 | Fenner | 156/345 |
| 6,387,719 B1 | 5/2002 | Mvros et al. | 438/21 |
| 6,392,351 B1 | 5/2002 | Shun'ko | 315/111.51 |
| 6,395,150 B1 | 5/2002 | Can Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,432,260 B1 | 8/2002 | Mahoney et al. | 156/345.35 |
| 6,433,553 B1 | 8/2002 | Goeckner et al. | 324/464 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,492,612 B1 | 12/2002 | Taguchi et al. | 219/121.43 |
| 6,494,986 B1 | 12/2002 | Hanawa et al. | 156/345.35 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,551,446 B1 | 4/2003 | Hanawa et al. | 156/345.48 |
| 6,559,408 B2 | 5/2003 | Smith et al. | 219/121.57 |
| 6,579,805 B1 | 6/2003 | Bar-Gadda | 438/710 |
| 6,582,999 B2 | 6/2003 | Henley et al. | 438/221 |
| 6,593,173 B1 | 7/2003 | Anc et al. | 438/149 |
| 6,643,557 B1 | 11/2003 | Miller et al. | 700/110 |
| 6,645,828 B1 | 11/2003 | Farrens et al. | 438/455 |
| 6,656,822 B2 * | 12/2003 | Doyle et al. | 438/523 |
| 6,679,981 B1 | 1/2004 | Pan et al. | 204/298.06 |
| 6,747,243 B1 | 6/2004 | Reinhardt | 219/121.69 |
| 6,780,759 B2 | 8/2004 | Farrens et al. | 438/635 |
| 6,800,559 B2 | 10/2004 | Bar-Gadda | 438/710 |

| | | |
|---|---|---|
| 6,811,448 B1 | 11/2004 | Paton et al. ............... 439/706 |
| 6,838,695 B2 | 1/2005 | Doris et al. ................. 257/55 |
| 6,887,341 B2 | 5/2005 | Strang et al. .......... 156/345.48 |
| 2001/0042827 A1 | 11/2001 | Fang et al. |
| 2002/0047543 A1 | 4/2002 | Sugai et al. ............ 315/111.21 |
| 2003/0013260 A1 | 1/2003 | Gossman et al. .......... 438/301 |
| 2003/0013314 A1 | 1/2003 | Ying et al. ................. 438/710 |
| 2003/0029567 A1 | 2/2003 | Dhindsa et al. ....... 156/345.47 |
| 2003/0085205 A1 | 5/2003 | Lai et al. ............... 219/121.43 |
| 2003/0211705 A1 | 11/2003 | Tong et al. ................. 438/455 |
| 2004/0036038 A1 | 2/2004 | Okumura et al. ........ 250/492.2 |
| 2004/0092084 A1 | 5/2004 | Rayssac ..................... 438/455 |
| 2004/0126993 A1 | 7/2004 | Chan et al. ................ 438/455 |

FOREIGN PATENT DOCUMENTS

| | | |
|---|---|---|
| EP | 0 836 218 A2 | 4/1998 |
| EP | 0 964 074 A2 | 12/1999 |
| EP | 1 054 433 A1 | 11/2000 |
| EP | 1 111 084 A1 | 6/2001 |
| EP | 1 158 071 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 62290885 A | 12/1987 |
| JP | 04318168 A | 9/1992 |
| JP | 070455542 | 2/1995 |
| JP | 07130496 A | 5/1995 |
| JP | 09186337 A | 7/1997 |
| JP | 2000150908 | 5/2000 |
| WO | WO 99/00832 | 1/1999 |
| WO | WO 01/11650 A1 | 2/2001 |
| WO | WO 02/25694 A2 | 3/2002 |
| WO | WO 93/18201 | 9/2003 |

OTHER PUBLICATIONS

Zhang, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," By Hanwa, et al.

Wolf, Stanley and Taubner, Richard, "Silicon Processing for the VLSI Era", 2000, Lattice Press, vol. 1, pp. 303-308.

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

Chediak, Alex, et al., "SIMOX—The "Winner" for 300 mm SOI Wafer Fabrication", *TICS 5*, Apr. 26, 2002, pp. 1-6.

* cited by examiner

METHOD FOR ION IMPLANTING INSULATOR MATERIAL TO REDUCE DIELECTRIC CONSTANT

CROSS-REFERENCE TO RELATED APPLICATIONS

This application is a continuation-in-part of U.S. application Ser. No. 10/838,052 filed May 3, 2004 entitled LOW TEMPERATURE CVD PROCESS WITH CONFORMALITY, STRESS AND COMPOSITION by Hiroji Hanawa, et al., the disclosure of which is incorporated herein by reference and of which is a continuation-in-part of U.S. patent application Ser. No. 10/786,410 filed Feb. 24, 2004 now U.S. Pat. 6,893,907 entitled FABRICATION OF SILICON-ON-INSULATOR STRUCTURE USING PLASMA IMMERSION ION IMPLANTATION by Dan Maydan et al., which is a continuation-in-part of U.S. patent application Ser. No. 10/646,533 filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE by Kenneth Collins et al., which is a continuation-in-part of U.S. patent application Ser. No. 10/164,327 filed Jun. 5, 2003 now U.S. Pat. No. 6,939,434 entitled EXTERNALLY EXCITED TORROIDAL PLASMA SOURCE WITH MAGNETIC CONTROL OF ION DISTRIBUTION by Kenneth Collins et al., which is a continuation-inpart of U.S. patent application Ser. No. 09/636,435 filed Aug. 11, 2000 entitled EXTERNALLY EXCITED MULTIPLE TORROIDAL PLASMA SOURCE by Hiroji Hanawa et al., now issued as U.S. Pat. No. 6,494,986 B1, all of which are assigned to the present assignee.

BACKGROUND

With recent advances in integrated circuit design, there are now as many as six to ten insulated interconnect layers overlying the semiconductor transistors for devices using the current 90 nm design rules. The next generation may employ 35 nm design rules and may have as many as 12 to 14 insulated interconnect layers. These interconnect layers can have completely different conductor patterns and are connected to one another and to the transistor layer at different locations through contact vias extending vertically between the horizontal layers. It is the formation of the contact vias with which the present invention is concerned.

Due to the large number of interconnect layers and the total electrical path length they represent, the interconnect layers account for a significant proportion if not a majority of the total power losses in the integrated circuit.

To reduce resistive power losses in the integrated circuit, the interconnect layers and the contact vias typically employ copper as the principal conductor and silicon dioxide as the insulator. Because copper tends to diffuse through the silicon dioxide insulator material, a barrier layer is placed between the copper material and the silicon dioxide material wherever the two materials interface in the integrated circuit. The barrier layer is typically formed of an underlying tantalum nitride layer contacting the silicon dioxide insulator, and overlying pure (or nearly pure) tantalum layer and, finally, a copper seed layer over the pure tantalum layer. The copper conductor is deposited on the copper seed layer. Such a barrier layer prevents migration or diffusion of copper atoms into the silicon dioxide insulator material.

In order to reduce power losses and interference by capacitive coupling between adjacent interconnect layers, it is desirable to employ an insulating material with the lowest possible dielectric constant. Silicon dioxide can be employed because it has superior mechanical properties. However, silicon dioxide has a relatively high dielectric constant (about 4.0) and is therefore not ideal. It has been found that combining silicon dioxide with a species such as boron or phosphorus produces a glassy material having a lower dielectric constant. For example, combining silicon dioxide with boron produces boron silicate glass (BSG). BSG has a dielectric constant of 3.2. Other insulator materials have been developed having even lower dielectric constants, such as insulation material sold by Applied Materials, Inc., the present assignee, under the trademarks Black Diamond I (dielectric constant of <3.0) and Black Diamond II (dielectric constant of <2.6). These materials with such low dielectric constants provide very good electrical performance with minimum capacitive coupling between interconnect layers. Unfortunately, their mechanical properties are inferior to those of silicon dioxide because these materials tend to be porous and therefore are not as hard as silicon dioxide. This is a particularly difficult problem because the insulator layer deposited over an interconnect layer tends to form a very uneven top surface and must therefore be smoothed to a plane surface by chemical mechanical polishing. While silicon dioxide is a sufficiently hard material to be relatively impervious to flaking or cracking during chemical mechanical polishing, porous materials with low dielectric constant can be susceptible to damage during chemical mechanical polishing.

Therefore, what is needed is a hard insulator material having a low dielectric constant that can reliably withstand chemical mechanical polishing. Currently available insulator materials suitable for use in multiple interconnect layers of integrated circuits are either porous and weak or else have a relatively high dielectric constant.

SUMMARY OF THE INVENTION

An integrated microelectronic circuit has a multi-layer interconnect structure overlying the transistors consisting of stacked metal pattern layers and insulating layers separating adjacent ones of said metal pattern layers. Each of the insulating layers is a dielectric material with plural gas bubbles distributed within the volume of the dielectric material to reduce its dielectric constant, the gas bubbles being formed by ion implantation of a gaseous species into the dielectric material.

The method can include regulating the average diameter of the gas bubbles by regulating the energy of the ions of the gaseous species during the step of ion implanting, or by regulating the temperature of the workpiece during the ion implanting step or by regulating the ion implantation dose of the ion implantation step, or by ion implanting a bubble-enhancing species. The gaseous species can be a light, heavy or combination of light and heavy gaseous species (e.g, H, He, Ar, Xe, H and He, He and Xe, F and Xe, H and Ar, etc).

The step of ion implanting can be carried out by plasma immersion ion implantation in a torroidal source plasma reactor having at least one external reentrant conduit, by introducing a process gas comprising a precursor of the gaseous species to be ion implanted, and then coupling RF power to process gases in the reentrant conduit to generate an oscillating plasma current in a torroidal path that includes the reentrant conduit and a process zone adjacent the surface of the workpiece. The ion energy and implant depth profile is controlled by applying RF plasma bias power to the workpiece.

DETAILED DESCRIPTION OF THE INVENTION

Figure 1:
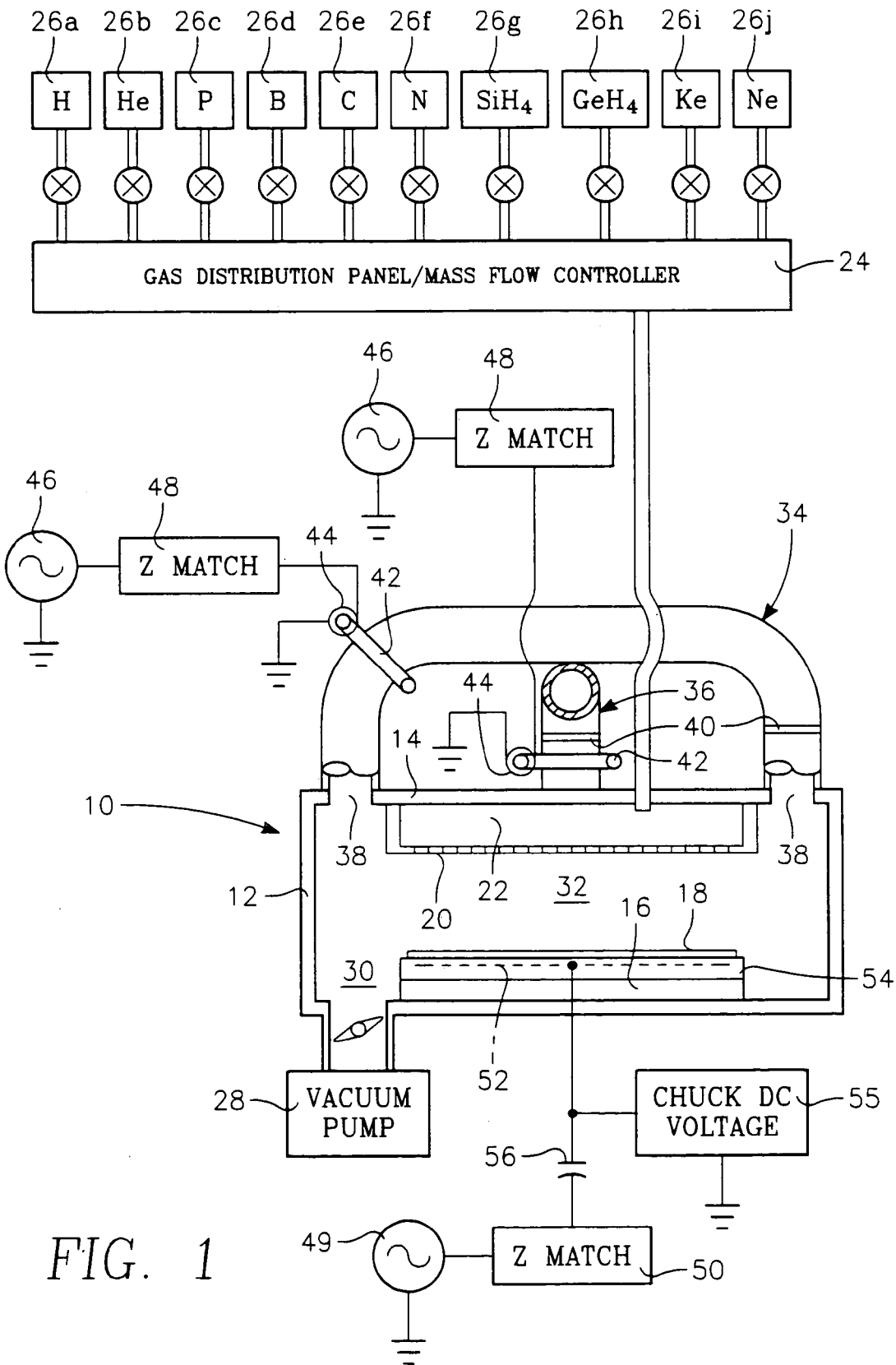
FIG. 1 is a diagram of a torroidal source plasma reactor adapted to carry out a process of an embodiment of the present invention.

In the present invention, an insulating material having excellent mechanical properties but poor electrical properties (a relatively high dielectric constant) is subject to ion implantation of a light gaseous species such as hydrogen or helium. The ion energy and dosage of the implantation process and the temperature of the insulating material are selected so that implanted atoms of the gaseous species inside the insulating material migrate or coalesce toward one another to form small gas bubbles throughout the insulating material. The gas bubbles within the insulating material have a very low dielectric constant (e.g., about 1.04). The result is that the total dielectric constant of the insulating layer is significantly reduced due to the presence of the bubbles. In the case of silicon dioxide containing bubbles formed by ion implantation of a gaseous species, the dielectric constant may be as low as 3.5. The reduction in dielectric constant depends upon the proportion of the volume within the insulating material occupied by the gas bubbles.

Other "bubble-enhancing" species, both gaseous and non-gaseous, may be implanted in addition to the gaseous species. The "enhancing" species may promote small bubble size. Also or alternatively, the "enhancing" species may promote bubble stability within the insulator (to avoid bubble growth or conjoining of adjacent bubbles). Small bubble size is desirable in order to ensure a smooth insulator material surface after etching or chemical mechanical polishing. Good bubble stability is desirable to permit close spacing between bubbles and a concomitantly higher bubble density within the insulating material for greater reduction in dielectric constant.

In accordance with another aspect of the invention, materials having superior electrical properties but inferior mechanical properties relative to silicon dioxide can have their mechanical properties improved without compromising their superior electrical properties. Examples of such materials include carbon-doped silicon dioxide, formed in a plasma containing silicon dioxide precursors (silane and oxygen) and a carbon precursor. Such materials tend to be porous and therefore mechanically weaker. Their superior electrical property is a dielectric constant (electrical permittivity) that is lower than that of silicon dioxide. Such materials may have their mechanical properties improved by ion implantation of a light gaseous species. In this process, ion implant dosage and energy and material temperature are selected so that the implanted gaseous species atoms gather within the empty pores of the insulator material to form a pressurized gas inside each pore. With each pore thus internally pressurized, the compressive strength or hardness of the insulator material is enhanced. Such a process may in some cases be referred to as a "hardening ion implantation" step. Ion implantation can also reduce tensile stress in the film (making it more compressive) through bond breaking and formation of damage.

In accordance with a yet further aspect of the invention, the porous material that has been mechanically improved by the foregoing "hardening ion implantation" step may also be electrically improved by the bubble-forming ion implantation step previously described. In this ion implantation step, a light gaseous species is implanted in the insulator material with the implant energy and dosage and material temperature adjusted so that the implanted gaseous atoms migrate toward one another within local regions to form gas bubbles within the material. These gas bubbles may be about 1–5 nm in diameter, which may be about the same size or smaller than the pores of the porous material. This addition of gas bubbles into the porous insulator material reduces its dielectric constant from its nominal value (e.g., <3.0 or <2.6 for carbon-doped silicon dioxide) to a lower level.

In a related aspect, the "hardening ion implantation" step and the bubble-formation ion implantation step may be one and the same ion implantation step or may be performed as part of the same ion implantation process, with the process parameters being changed during implantation to perform bubble formation, and then (or beforehand) hardening.

An important aspect is the ability to control both ion implantation dosage and ion energy in order to control bubble size. A lower ion energy enables the process to form smaller and more numerous bubbles. On the other hand, an entire wafer must be implanted, and therefore a large ion flux is necessary to complete the implantation process within a reasonable amount of time. In view of these requirements, the preferred way of performing the bubble-forming ion implantation step is to employ a torroidal source plasma ion immersion implantation reactor described in the above-referenced parent application. This is because such a reactor is capable of very high maximum ion flux and a very low minimum ion energy. In addition, in order to minimize the material temperature during ion implantation (to minimize bubble size), the minimum plasma source power level in such a reactor is extremely low, relative to other plasma immersion ion implantation reactors. By minimizing plasma source power, the temperature of the insulator material during ion implantation can be significantly reduced to achieve a minimum bubble size. Such a reactor, adapted particularly for bubble-forming ion implantation, is illustrated in FIG. 1.

Referring now to FIG. 1, a torroidal source plasma immersion ion implantation ("P3I") reactor of the type disclosed in the above-reference parent application has a cylindrical vacuum chamber 10 defined by a cylindrical side wall 12 and a disk-shaped ceiling 14. A wafer support pedestal 16 at the floor of the chamber supports a semiconductor wafer 18 to be processed. A gas distribution plate or showerhead 20 on the ceiling 14 receives process gas in its gas manifold 22 from a gas distribution panel 24 whose gas output can be any one of or mixtures of gases from individual gas supplies 26a–26j of hydrogen, helium, phosphorus-containing gas, boron-containing gas, a carbon-containing gas, nitrogen, silane, germanium-hydride gas, krypton, xenon, argon, respectively. A vacuum pump 28 is coupled to a pumping annulus 30 defined between the wafer support pedestal 16 and the sidewall 12. A process region 32 is defined between the wafer 18 and the gas distribution plate 20.

A pair of external reentrant conduits 34, 36 establish reentrant torroidal paths for plasma currents passing through the process region, the torroidal paths intersecting in the process region 32. Each of the conduits 34, 36 has a pair of ends 38 coupled to opposite sides of the chamber. Each conduit 34, 36 is a hollow conductive tube. Each conduit 34, 36 has a D.C. insulation ring 40 preventing the formation of a closed loop conductive path between the two ends of the conduit.

An annular portion of each conduit 34, 36, is surrounded by an annular magnetic core 42. An excitation coil 44 surrounding the core 42 is coupled to an RF power source 46 through an impedance match device 48. The two RF power sources 46 coupled to respective ones of the cores 44 may be of two slightly different frequencies. The RF power coupled from the RF power generators 46 produces plasma ion currents in closed torroidal paths extending through the respective conduit 34, 36 and through the process region 32. These ion currents oscillate at the frequency of the respective RF power source 34, 36. Bias power is applied to the wafer support pedestal 16 by a bias power generator 49 through an impedance match circuit 50.

Plasma immersion ion implantation of the wafer 18 is performed by introducing a gas or multiple of gases containing the species to be ion implanted into the chamber 32 through the gas distribution plate 20 and applying sufficient source power from the generators 46 to the reentrant conduits 34, 36 to create torroidal plasma currents in the conduits and in the process region 32. The ion implantation depth is determined by the wafer bias voltage applied by the RF bias power generator 49. The ion implantation rate or flux (number of ions implanted per square cm per second) is determined by the plasma density, which is controlled by the level of RF power applied by the RF source power generators 46. The cumulative implant dose (ions/square cm) in the wafer 18 is determined by both the flux and the total time over which the flux is maintained.

If the wafer support pedestal 16 is an electrostatic chuck, then a buried electrode 52 is provided within an insulating plate 54 of the wafer support pedestal, and the buried electrode 52 is coupled to the bias power generator 49 through the impedance match circuit 50. The wafer support pedestal 16 may be of the type disclosed in FIGS. 97 and 98 of the above-referenced parent application.

The dielectric constant (electrical permittivity) of an insulating layer on a semiconductor wafer is reduced by placing the wafer 18 on the wafer support pedestal 16, introducing a gaseous species into the chamber 10 and striking a plasma so that the gaseous species is ion implanted into the insulating layer. The wafer bias voltage delivered by the RF bias power generator 49 is adjusted so that the implant depth of the gaseous species is within the insulating layer. The gaseous species may be any one of or combination of hydrogen, helium, nitrogen, neon, argon, krypton, xenon, fluorine, chlorine, iodine, bromine, oxygen.

Figure 2A:
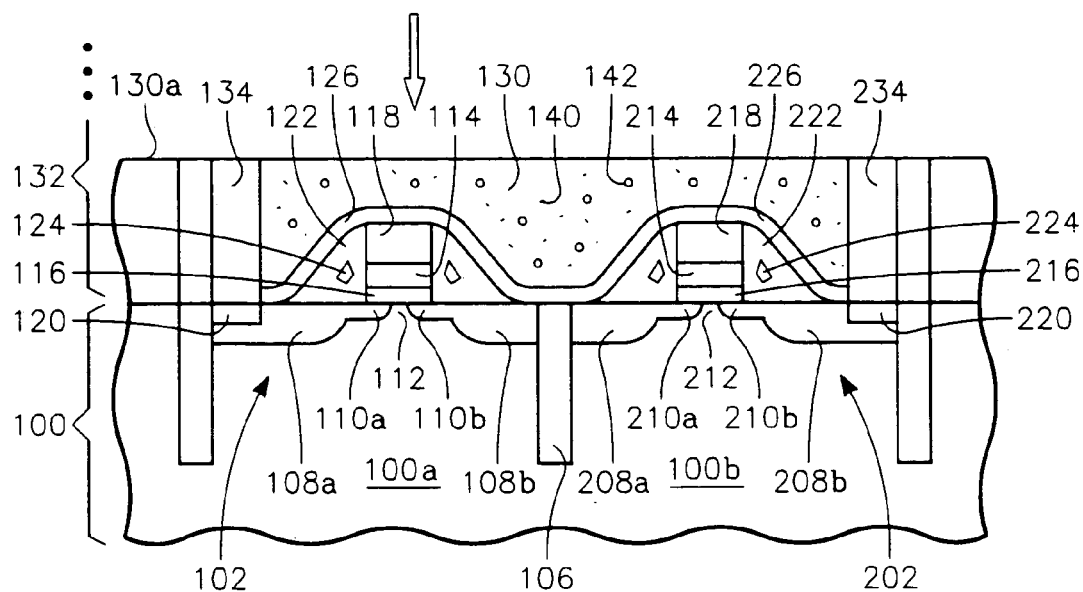
FIGS. 2A, 2B and 2C are successive cross-sectional views of an integrated circuit illustrating a process sequence in the fabrication of a multi-layer interconnect structure of an integrated circuit in accordance with one aspect.

FIG. 2A is a cross-sectional side view of an integrated circuit formed on the wafer 18 of FIG. 1. The transistor and interconnection structure of the circuit of FIG. 2A is conventional, with the exception of gaseous bubbles in the Insulated layer formed by ion implantation. The circuit of FIG. 2A includes an active semiconductor layer 100. The active semiconductor layer 100 may be the bulk semiconductor material of the wafer 18, or, preferably, is a silicon island (not shown) formed on an insulating layer over the wafer. The circuit of FIG. 2 consists of a pair of transistors, namely a PMOS transistor 102 formed in a lightly n-doped region 100a of the active layer 100, and an NMOS transistor 202 formed in a lightly p-doped region 100b of the active layer 100. The p- and n-doped regions 100a, 100b are insulated from one another by a shallow isolation trench 106 dug into the active layer and filled with an insulating material such as silicon dioxide.

The PMOS transistor 102 includes heavily p-doped source and drain regions 108a, 108b in the active layer and heavily p-doped source and drain extensions 110a, 110b separated by an n-doped channel 112. A polycrystalline silicon gate electrode 114 overlies the channel 112 and is separated from it by a thin gate silicon dioxide layer 116. A titanium silicide (or cobalt silicide) gate contact 118 overlies the gate electrode 114. A titanium silicide (or cobalt silicide) source contact region 120 is formed in the source region 108a. A silicon nitride insulation layer 122 overlies the source and drain region 108a, 108b and surrounds the gate electrode structure 114, 116, 118. Silicon dioxide islands 124 lie within the insulation layer 122. A thin silicon nitride etch stop layer 126 overlies the PMOS transistor 102. The bottom insulation layer 130 of what will become an overlying multiple interconnect layer 132 overlies the etch stop layer 126. After the insulation layer 130 is formed, it is subjected to a chemical mechanical polishing process to render its top surface 130a perfectly flat as illustrated in FIG. 2A. A metallic (e.g., tin) source contact 134 extends vertically through the insulation layer 130 and through the etch stop layer 126 to the titanium silicide source contact region 120. The insulation layer may be silicon dioxide (SiO2), or silicon dioxide-containing combinations such as phosphorus silicate glass (PSG), boron silicate glass (BSG) or carbon-doped silicate glass (CSG). Such combinations can be formed in a plasma-enhanced deposition process using a process gas containing a silicon precursor (e.g., silane), oxygen and a phosphorus precursor gas ($PH_3$) or a boron precursor gas (B2H6) or a carbon-containing gas.

The NMOS transistor 202 includes heavily n-doped source and drain regions 208a, 208b in the active layer and heavily n-doped source and drain extensions 210a, 210b separated by a p-doped channel 212. A polycrystalline silicon gate electrode 214 overlies the channel 212 and is separated from it by a thin gate silicon dioxide layer 216. A titanium silicide gate contact 218 overlies the gate electrode 214. A titanium silicide source contact region 220 is formed in the source region 208a. A silicon nitride insulation layer 222 overlies the source and drain region 208a, 208b and surrounds the gate electrode structure 214, 216, 218. Silicon dioxide islands 224 lie within the insulation layer 222. A thin silicon nitride etch stop layer 226 overlies the NMOS transistor 202. The bottom insulation layer 130 of the overlying multiple interconnect layer 132 overlies the etch stop layer 226. A metallic (e.g., TiN) drain contact 234 extends vertically through the insulation layer 130 and through the etch stop layer 226 to the titanium silicide source contact region 220.

The insulating layer 130 (which may be, for example, PSG, BSG, CSG or SiO2) is unique in that it holds a three-dimensional matrix of gas bubbles formed by ion implantation of a gaseous species. FIG. 2A depicts the performance of this ion implantation step, as carried out (preferably) in the torroidal source P3i reactor of FIG. 1. In this step, the first insulation layer 130 of the multiple interconnect layer 132 has been deposited, and is completely exposed. The plasma consists of ions 140 of a light gaseous species, such as hydrogen or helium, for example. The ions 140 are accelerated down to the wafer 18 to be implanted in the insulator layer 130 by the wafer bias voltage from the RF bias power generator 49 of FIG. 1 applied to the support pedestal electrode 52. The implanted gaseous species atoms within the insulator layer migrate toward one another to gather in many small gas bubbles 142 distributed throughout the insulator layer 130. Ideally, the gas bubbles 142 are very small (about 1–5 nm in diameter) and are distributed uniformly throughout the insulator layer 130 as a three-dimensional matrix of gas bubbles. Depending upon the temperature of the post-implantation anneal process, the implanted gas species may evolve out of the material or coalesce to form larger gas bubbles. Such bubbles are very stable and may not burst till reaching the melting temperature of the materials. These bubbles represent regions of lower dielectric constant relative to the solid portions of the film.

Figure 2B:
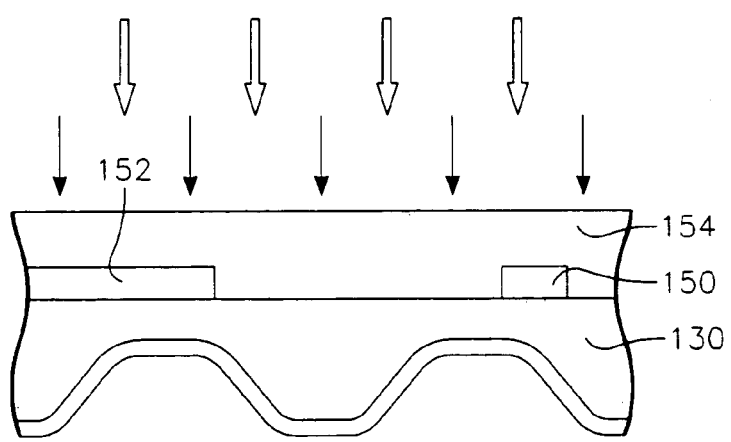

FIG. 2B depicts the next step, which follows the deposition of a first layer of interconnection metal conductors (such as the conductors 150, 152) on the top surface of the insulation layer 130. This next step consists of the formation of a second insulation layer 154 and ion implantation of a gaseous species (e.g., hydrogen, helium) into the second insulation layer 154 to form the same type of gas bubble matrix as was formed in the step of FIG. 2A. As will be discussed below in this specification, the deposition of the insulation layer (such as the insulation layer 154) and the ion implantation of the bubble-forming gaseous species can be carried out at separate times, or may be performed simultaneously. The ion implantation depth is adjusted (by adjusting the power level of the bias power generator 49, which adjusts the wafer bias voltage) so that the implant depth or profile corresponds to the thickness of the insulation layer 154.

Figure 2C:
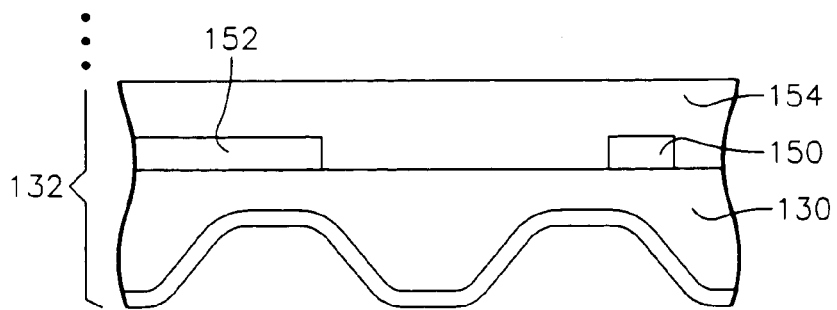

FIG. 2C illustrates the final result, showing the presence of gas bubbles 142 distributed through the first and second insulation layers 130, 154. The foregoing steps are repeated several times, depending upon the number of layers to be formed in the multiple interconnect layer 132.

FIG. 3 depicts the implantation of gaseous species ions 310 into an insulating material 320, and the migration of the ions 310 within the insulating material 320 to form gas bubbles. Initially, each ion 310 follows a vertical trajectory A from the plasma, passing through the top surface 320a of the insulating material 320. The different ions 310 stop within the insulating material at different locations B depending upon their point of entry C in the top surface 320a and depending upon their individual kinetic energies. The gaseous species ions 310, upon stopping at their respective locations B within the insulating material 320, have become neutral atoms. The gaseous species atoms 310 that have come to rest within the insulating layer 320 are attracted to one another, and therefore migrate through the insulating layer 320 along paths D toward centers of concentration E of the gaseous species atoms. This migration continues until at least nearly all gaseous species atoms 310 have accumulated in respective centers of concentration. The gaseous species atoms gathering within each center of concentration E draw sufficiently close together until the center of concentration E becomes a gas bubble 330.

The spacing or density of the gas bubbles 330 within the insulating layer 320 determines the reduction of the dielectric constant of the insulating layer 320. This is because the reduction in the dielectric constant of the insulating layer 320 is determined at least in large part by the proportion of volume within the insulating layer 320 occupied by all the gas bubbles. This is depicted in the graph of FIG. 3B, showing how the dielectric constant, k, is 4 in the case of pure silicon dioxide, and is slight over 1 in the case of pure helium gas. As the total volume occupied by the gas bubbles within the insulating layer 320 increases from zero towards 50%, the dielectric constant, k, decreases from 4 to about 2.5. Therefore the smaller the spacing S between bubbles 330, the greater the volume occupied by gas in the insulator layer, and therefore the more the dielectric constant is decreased.

Figure 4A:
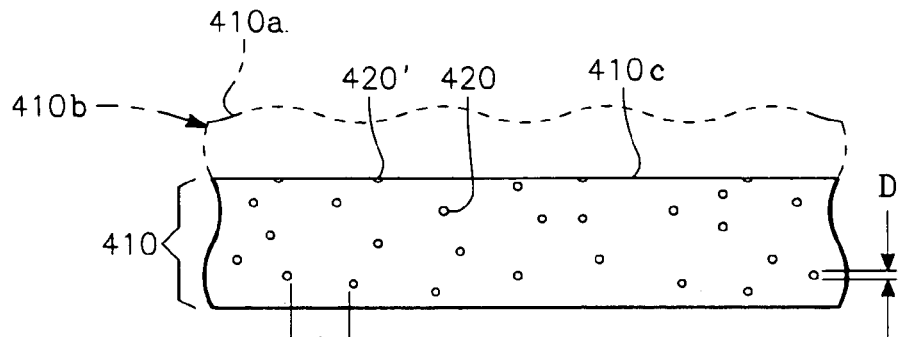
FIGS. 4A and 4B are cross-sectional side views of a portion of an integrated circuit illustrating successive steps in the formation of a multi-layer interconnect structure.

FIG. 4A is an enlarged view of an insulation material 410 impregnated with many small gas bubbles 420 to form a three-dimensional matrix of gas bubbles 420 in accordance with the above-described processes. The spacing S or density of the bubbles 420 within the material 410 determines the reduction in dielectric constant of the insulation material 410. The average diameter D of the bubbles must be controlled to ensure good mechanical properties of the material. Specifically, the average bubble diameter D is preferably minimized to avoid potentially undesirable material properties arising from an etch process or a chemical mechanical polishing process.

With regard to chemical mechanical polishing, the insulator layer 410 initially has a rough or non-planar surface 410a immediately following its formation, as indicated in dashed line. In order to form a high quality conductor pattern over the insulator, it must first be chemically mechanically polished. This removes a top layer 410*b* of the material 410 to form a smooth planar surface 410*c*. However, prior to the chemical mechanical polishing step that removed the top layer 410*b*, some of the gas bubbles 420 lay across the boundary that eventually became the planar surface 410*c*, and may be referred to as boundary gas bubbles 420'. The boundary gas bubbles 420' are cut open and become small holes upon removal of the top layer 410*b*. As a result, the otherwise smooth surface 410*c* has holes in it. These holes have no effect upon subsequent process steps (e.g., deposition of a metal conductor pattern on the top surface 410*c*) provided the hole size (bubble diameter D) is small. For this purpose, the bubble diameter is preferably within a range of 1–5 nm.

Figure 4B:
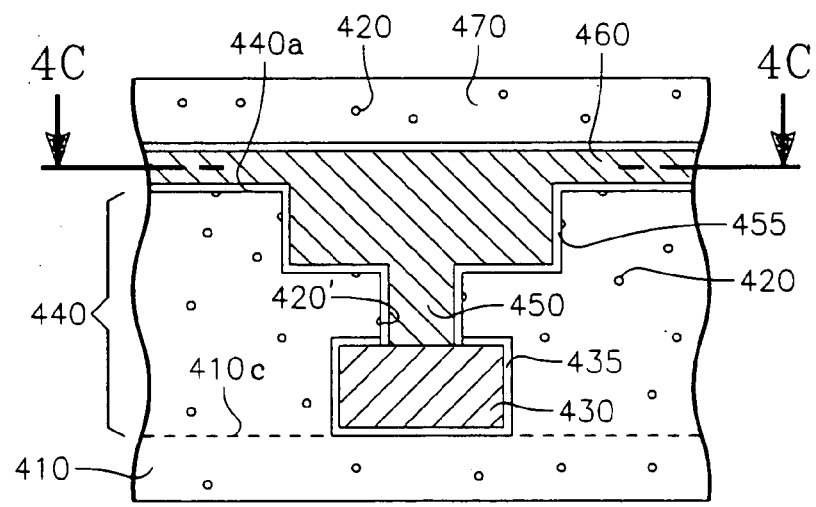
Figure 4C:
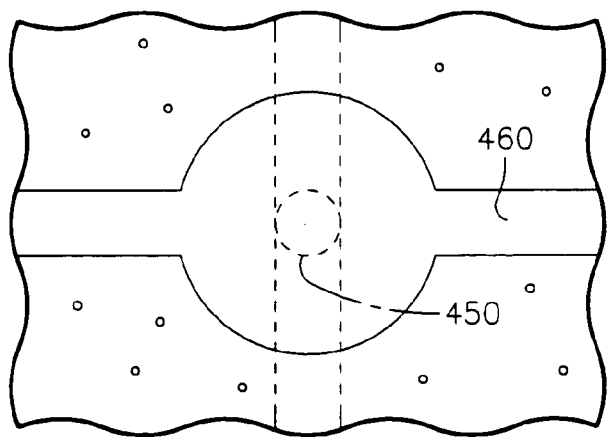
FIG. 4C is a top view corresponding to FIG. 4B.

FIGS. 4B and 4C are side and top cross-sectional views of two layers of a multiple interconnect layer that includes the insulator layer 410 of FIG. 4A. A copper conductor 430 partially surrounded by a barrier layer 435 is deposited on the insulator top surface 410*c*, and then a second insulator layer 440 is deposited over the conductor 430 and the exposed portion of the top surface 410*c*. The top surface 440*a* of the second insulator layer 440 is smoothed by chemical mechanical polishing. The second layer 440 is implanted with a gaseous species to form gas bubbles 420 therein in the manner described above. This ion implantation step may be performed either before or after the second layer top surface 440*a* has been smoothed. A vertical contact via opening 450 is etched through the second insulator layer 440, which opens those bubbles 420' at the surface formed by the etching process. A barrier layer 455 and an upper level conductor pattern 460 are deposited in the contact via opening and on the top surface 440*a* of the second insulator layer 440. A third insulator layer 470 is formed over the conductor pattern 460 and over the exposed portion of the second insulator layer top surface 440*a*. The third layer 470 is ion implanted with a gaseous species to form a matrix of gas bubbles 420 in the third layer 470. Each time a top surface (such as, for example, the top surface 440*a*) is polished or an opening (such as, for example, the opening or via 450) is etched in an insulator layer (such as, for example, the insulator layer 440), some of the gas bubbles (namely, the boundary gas bubbles 420') are exposed or partially opened, forming small holes in the etched surface. By regulating the average bubble size within a small range (1–5 nm), the exposed holes are reliably filled upon the deposition of a barrier layer 435 or 455 or metal pattern 460.

There are several ways for regulating the average bubble size. These include selecting ion energy (by selecting plasma bias power), controlling ion implant dose (by controlling plasma ion density and process time), controlling the wafer temperature and selecting a gas species of a particular atomic number, and co-implanting non-gaseous or gaseous species that promotes bubble stability and/or small bubble size. Each of these approaches will now be discussed.

Figure 5:
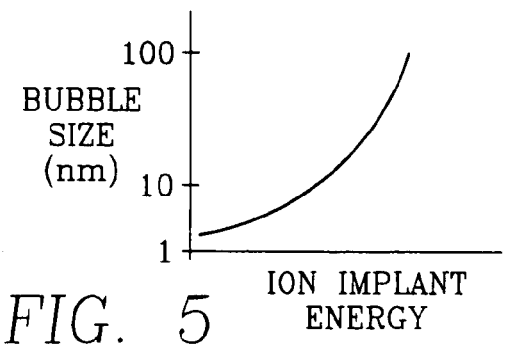
FIG. 5 is a graph illustrating the dependency of ion implanted gas bubble average size on ion implantation energy.

The graph of FIG. 5 indicates that the average gas bubble diameter D tends to decrease as ion implantation energy (ion kinetic energy) is decreased. Since it is important to minimize the average gas bubble diameter D, use of the torroidal source P3i reactor of FIG. 1 provides the best results, because this reactor is capable of very high implant dose rates at very low ion kinetic energy. Thus, one way of regulating the gas bubbles to a small average diameter is by using a relatively small bias power level for a small ion energy.

Figure 6:
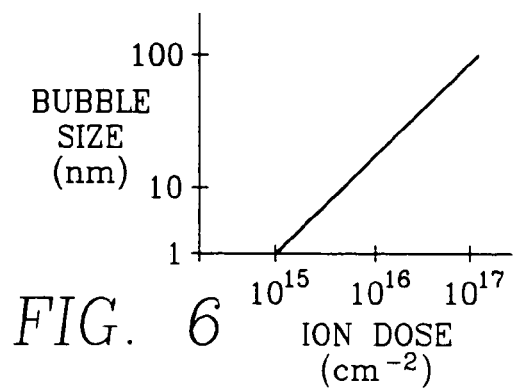
FIG. 6 is a graph illustrating the dependency of ion implanted gas bubble average size on ion implantation dose.

The graph of FIG. 6 indicates that the average gas bubble diameter D tends to decrease as the ion implantation dose (implanted atoms per square centimeter) is decreased.

Therefore, another way of regulating the average gas bubble diameter D is to limit the ion implant dose of the gaseous species atoms. However, the decrease in implant dose may diminish the desired reduction in dielectric constant of the implanted insulation material, and therefore only a limited reduction in implant dosage may be preferred.

Figure 7:
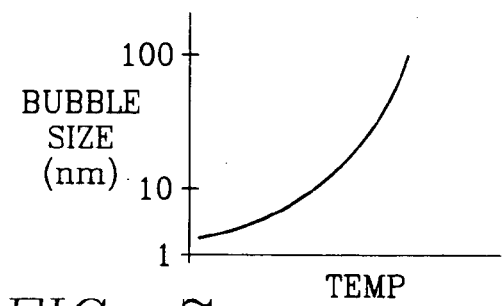
FIG. 7 is a graph illustrating the dependency of ion implanted gas bubble average size on workpiece temperature.

The graph of FIG. 7 indicates that the average gas bubble diameter D decreases with the temperature of the insulation layer. Therefore, it is desirable to minimize the amount of heat load on the wafer, which is readily accomplished by reducing the RF plasma source power. However, most plasma reactors have relatively high source power threshold levels for maintaining a plasma, preventing a significant reduction in heat load. This problem is solved by employing the torroidal source P3i reactor of FIG. 1, because this reactor can maintain a relatively dense plasma in the process region at an extremely low source power level (e.g., about 100 Watts). Accordingly, the average gas bubble diameter D is reduced by carrying out the gaseous species ion implantation in the torroidal source P3i reactor of FIG. 1 and using a very low source power level, as low as 100 Watts for example.

Figure 8:
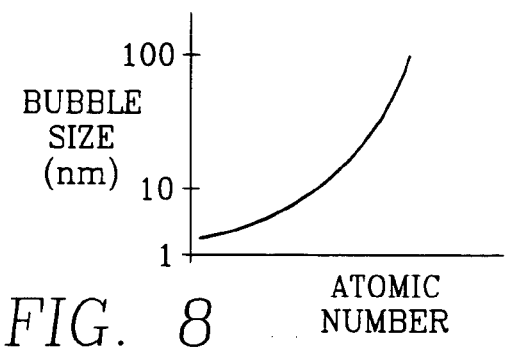
FIG. 8 is a graph illustrating the dependency of ion implanted gas bubble average size on the atomic weight or number of the gaseous species.

The graph of FIG. 8 indicates that the gas bubble average diameter D is less for ion implanted gas species of lesser atomic numbers. Therefore, the gas bubble average diameter D may be minimized by employing the lightest gas species for the gas bubble-forming implant step. For example, P3i ion implantation of the lightest gaseous species, such as hydrogen or helium, minimizes bubble diameter. However, it may be possible to achieve reasonable gas bubble sizes with heavier gaseous species, such as xenon or nitrogen, or combination of species and therefore the invention may not be limited to the lightest gaseous species.

The foregoing parameters (ion energy, ion dose, wafer temperature and atomic weight) may be selected to favor a smaller average gas bubble diameter D, with some of these parameters playing a larger role than others. For example, it may not be desirable to radically reduce ion dose, since that might diminish the improvement (reduction) in dielectric constant. The other parameters may be optimized to the maximum, by employing a low ion energy, a low source power level (for small heat load) and using the lightest gas species (hydrogen or helium).

Figure 9:
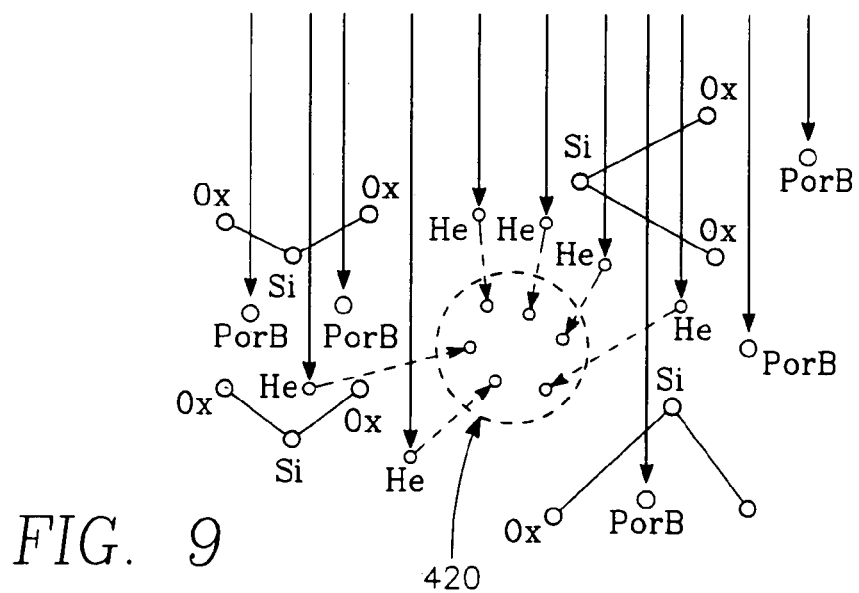
FIG. 9 is a diagram depicting the simultaneous ion implantation of a light gaseous species and a bubble-enhancing species into a silicon dioxide atomic lattice or material.

FIG. 9 illustrates a co-implantation process in which ion implantation of the primary species (the bubble-forming gaseous species such as hydrogen or helium) is carried out simultaneously with ion implantation of a secondary species. The secondary species may be gaseous or non-gaseous, and enhances the properties of the ion implanted bubbles in the insulation material. Such enhancement may be promotion of a smaller average gas bubble diameter D in the insulation material or an improvement in gas bubble stability. An improvement in gas bubble stability refers to the tendency of a bubble to migrate to and/or join another gas bubble. The secondary species may be any one of a number of process compatible species. These include phosphorus, boron, arsenic, oxygen, carbon, silicon, germanium, helium, neon, argon, nitrogen, and xenon. The co-implantation is achieved by introducing a precursor gas into the reactor chamber 10 containing the desired secondary species, along with the primary or gaseous species.

In FIG. 9, the insulation material is silicon dioxide, as indicated by the bonds between each silicon atom and pair of oxygen atoms. FIG. 9 depicts the dielectric material as an atomic lattice of silicon atoms and oxygen atoms, each silicon atom being bound to a pair of oxygen atoms. This lattice may be referred to as the dielectric material, the dielectric layer or the insulation layer. Atoms of the implanted gaseous species (helium in the illustrated example of FIG. 9) come to rest in various locations and then migrate through the insulation layer to combine into gas bubbles 420. The implanted secondary species for enhancing the gas bubble properties (phosphorus in the illustrated example of FIG. 9) reside in distributed locations throughout the insulation material. The helium and phosphorus atoms must be implanted within the same depth range, corresponding to the thickness of the insulation layer. In order to ensure that the heavier secondary atoms and the light primary atoms are implanted in the same depth range (corresponding to the thickness of the insulation layer), the bias power (voltage) applied to the wafer support pedestal may be shifted within a range that spans the desired implant depth range for both atomic species. This is not limited to helium and phosphorus, and combinations of species other than helium and phosphorus may be employed.

Figure 10A:
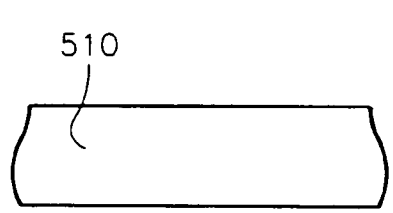
FIGS. 10A through 10F are successive cross-sectional side views of a workpiece illustrating the formation of a thick dielectric layer ion implanted with a gaseous species with an ion implantation profile that is very shallow relative to the final dielectric layer thickness by successive deposition and implantation of many thin dielectric layers.
Figure 10B:
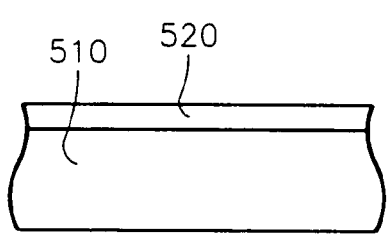
Figure 10C:
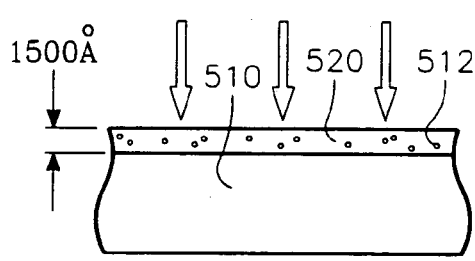
Figure 10D:
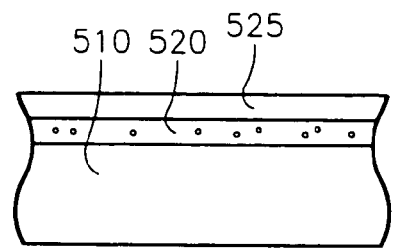
Figure 10E:
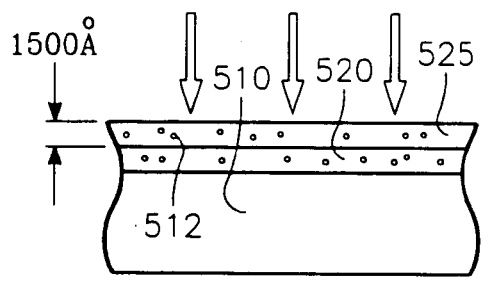
Figure 10F:
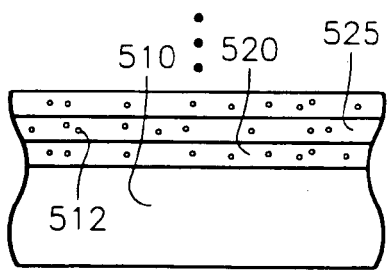
Figure 10G:
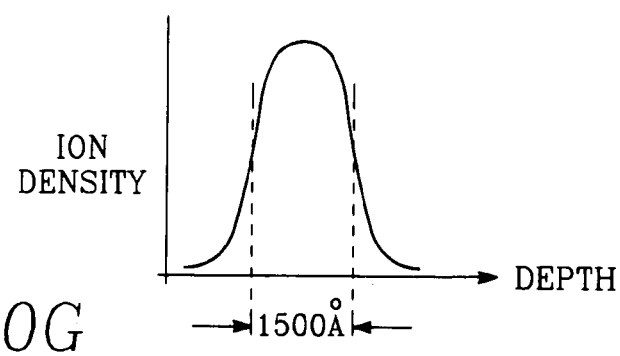
FIG. 10G is a graph depicting the ion implantation depth profile employed in the process of FIGS. 10A through 10F, in which the vertical axis is implanted ion density in atoms per cubic centimeter and the horizontal axis is implantation depth below the top surface of the dielectric material.

In order to help minimize the gas bubble average diameter D, the ion energy should be reduced or minimized. But this limits the ion implantation depth profile. In attempting to form gas bubbles in a very thick insulation layer, the layer thickness may exceed the implant depth range for a very low energy ion implantation process. One way around this problem is to form the thick insulation layer by successive depositions of very thin insulation layers, and conduct a bubble-forming gas species ion implantation step after the formation of each of the successive thin insulation layers. Such a procedure is depicted in FIGS. 10A through 10F. A substrate 510 shown in FIG. 10A receives a thin (1500 angstrom) insulation layer 520 shown in FIG. 10B. Gas bubbles 512 are formed in the thin layer 520 by ion implantation of a light gaseous species, as shown in FIG. 10C. Then, the next thin insulation layer 525 is formed over the current thin insulation layer 520, as shown in FIG. 10D. Gas bubbles 512 are formed in the second thin insulation layer 520 by ion implantation of a light gaseous species. The process is repeated as necessary until a required number of thin layers have been deposited, each having implanted gas bubbles 512. In this way, only a very low ion energy is required, corresponding an ion implant depth profile spanning 1500 angstroms. Such a depth profile is depicted in the graph of FIG. 10G, showing implanted gaseous species ion density in the insulation layer as a function of depth.

Figure 11A:
FIGS. 11A through 11C are successive cross-sectional side views of an workpiece illustrating simultaneous deposition of a dielectric layer and ion implantation of a gaseous species.
Figure 11B:
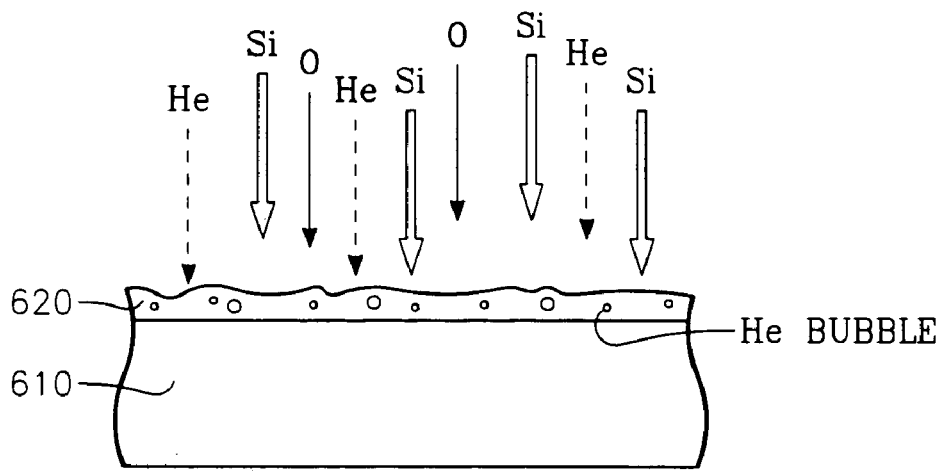
Figure 11C:
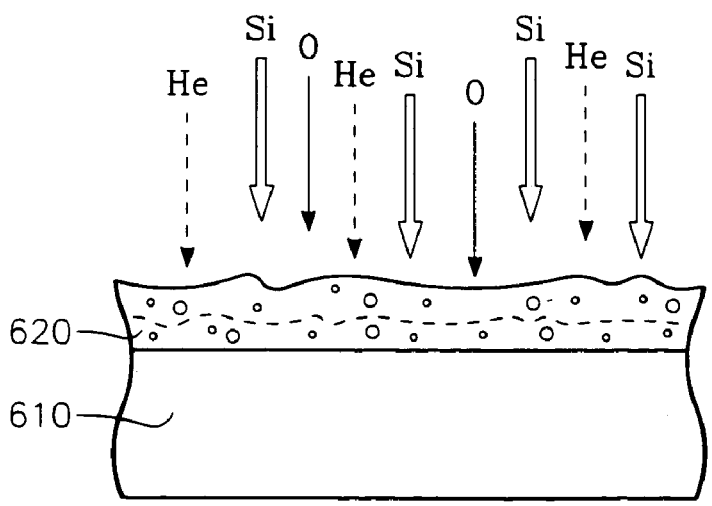
Figure 12A:
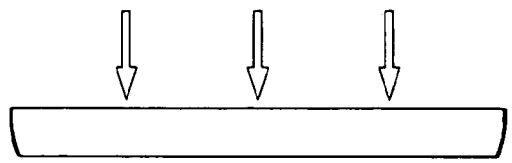
FIGS. 12A through 12E are successive views of a workpiece illustrating simultaneous dielectric layer deposition and very shallow gaseous species ion implantation.
Figure 12B:
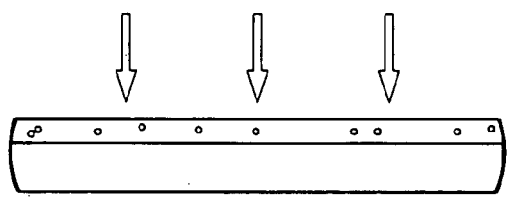
Figure 12C:
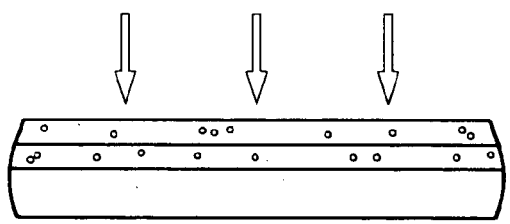
Figure 12D:
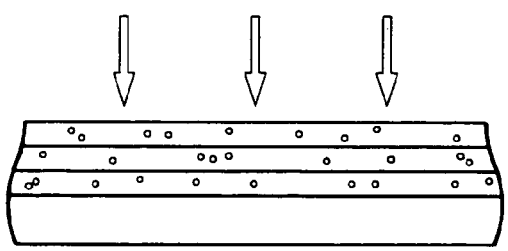
Figure 12E:
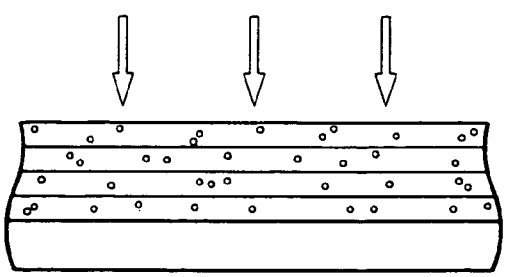

Another procedure for minimizing the required ion energy to form gas bubbles by ion implantation of a very thick insulation layer is to form the thick insulation layer by deposition of the insulator material (e.g., silicon dioxide) at a controlled rate. Simultaneously with the deposition, gaseous species are implanted at a shallow depth below the surface of the continuously thickening insulation layer, so that the surface is continually rising. In this way, the implantation depth profile can be extremely shallow regardless of the ultimate thickness of the deposited insulation layer. Such a procedure is illustrated in FIGS. 11A through 11C. A substrate 610 shown in FIG. 11A is exposed to a plasma formed from silane, oxygen and helium gases (other gases are possible such as SiF4, O2, He and Xe). The silane and oxygen gases dissociate in the plasma into silicon, oxygen and hydrogen, the silicon and oxygen ions combining to form silicon dioxide which deposits on the top surface of the substrate of FIG. 11A to grow a silicon dioxide insulating layer 620, as shown in FIG. 11B. Simultaneously, the helium ions penetrate the surface of the silicon dioxide layer 620 to be implanted within the silicon dioxide layer 620. The helium is implanted in a depth profile spanning a thickness of about 1500 angstroms. The growth rate of the silicon dioxide and the dose rate of the helium ion implantation are adjusted so that as each 1500 angstroms of the growing silicon dioxide layer receives the desired helium dose, the insulation layer has grown by about 1500 angstroms, so that the desired dose of helium atoms is implanted continuously as the insulation layer grows. This situation is depicted in the sequence illustrated in FIGS. 12A through 12E, showing how the silicon dioxide layer increases in thickness while the top 1500 angstroms of that layer continues to be implanted with helium atoms. The top surface of the insulating layer continues to receive new silicon dioxide material and therefore is continuously rising during the helium ion implantation. The implanted helium atoms gather together in many small bubbles to form a matrix of gas bubbles throughout the insulation layer.

The ion implantation process can be employed to enhance the adhesion of an upper film of one material onto a lower film or substrate of a different material. This is because the ion implantation process carries some of the atoms of each of the two materials across the interface between the two layers.

In accordance with another aspect, ion implantation of a gaseous species may be used to harden a porous dielectric material, such as (for example) Black Diamond I and Black Diamond II dielectric material sold by Applied Materials, Inc, the present assignee. "Black Diamond" is a trademark of Applied Materials, Inc. Such porous materials have a lower dielectric constant than silicon dioxide or other dielectrics. However, the presence of empty pores distributed throughout the material tends to reduce its mechanical hardness or strength. What is needed is a way of strengthening a porous dielectric material (increase hardness and modulus) while retaining its superior electrical characteristics (low dielectric constant).

Figures 13A, 13B, 13C:
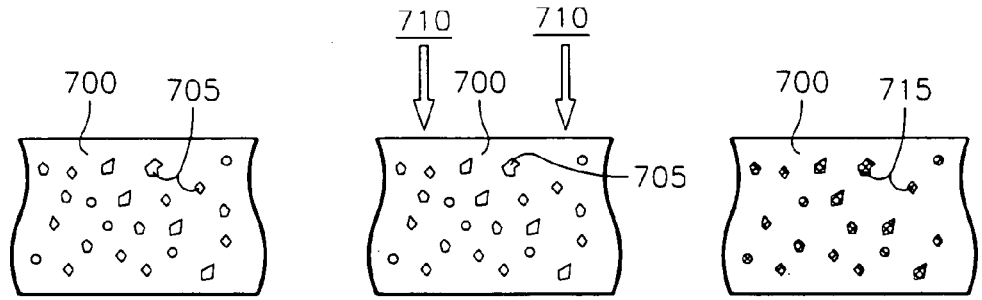
FIGS. 13A through 13C are successive cross-sectional side views of a porous dielectric material showing the hardening of such material by ion implantation of a gas species to fill each pore with gas.

FIG. 13A is a cross-sectional view of a portion of a porous dielectric material 700 having many empty pores 705 distributed throughout the volume of the material 700. In FIG. 13B, the porous dielectric material 700 is subject to an ion implantation process in which ions 710 of a gaseous species are implanted in the material 700. The implanted ions 710 become neutral atoms in the dielectric material 700 and tend to migrate toward and congregate within the pores 705. They do this to relieve stress in the lattice of the dielectric material 700. The implanted gaseous species atoms 710 congregating within each pore 705 form a gas 715, as indicated in FIG. 13C. For example, implanted helium atoms migrating into a pore can join together as He2 molecules within each pore 705. With sufficient ion implant dose, the implanted gaseous species atoms 710 are directed into the pores 705 with such a great force by the lattice strain that a significant gas pressure is created within each of the pores 705. This enhances the hardness of the material. Hardening of the porous dielectric material can enhance its ability to withstand chemical mechanical polishing or other stressful processes. Hardening occurs as a result of densification of the low K (dielectric constant) materials. Densification tends to increase K, but because gas bubble injection reduces K, the tendency of ion implantation to increase K is cancelled. As employed in this specification, the term densification refers to the breaking up of pores in the porous dielectric material into smaller pores. It is believed the size of the pores in a doped low-K dielectric material (such as carbon-doped silicon dioxide) prior to densification is on the order of nanometers. The breaking up of such pores into smaller pores is the result of the impact of the implanted ions and their interaction with the bonds in the dielectric material.

Figure 3A:
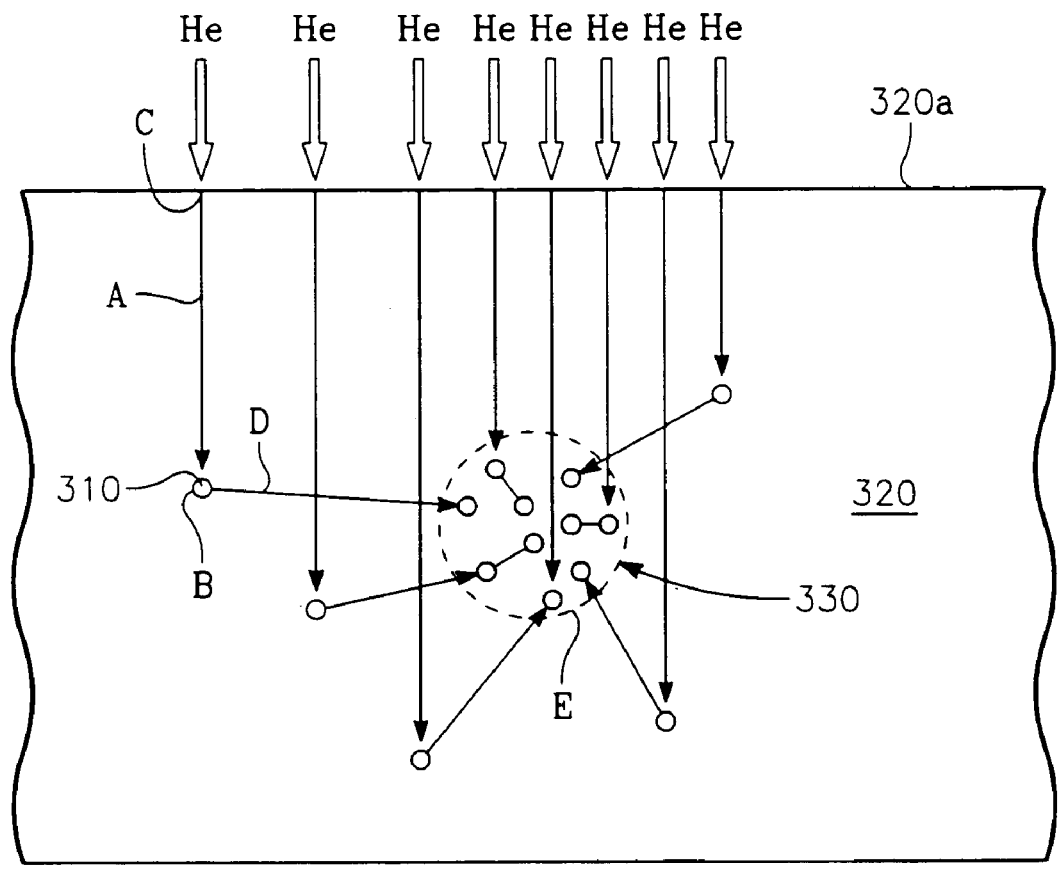
FIG. 3A is a cross-sectional view of a dielectric layer of an integrated circuit and depicts migration or congregating (or agglomeration) of implanted gaseous species in a dielectric material or lattice to form a gas bubble.
Figure 3B:
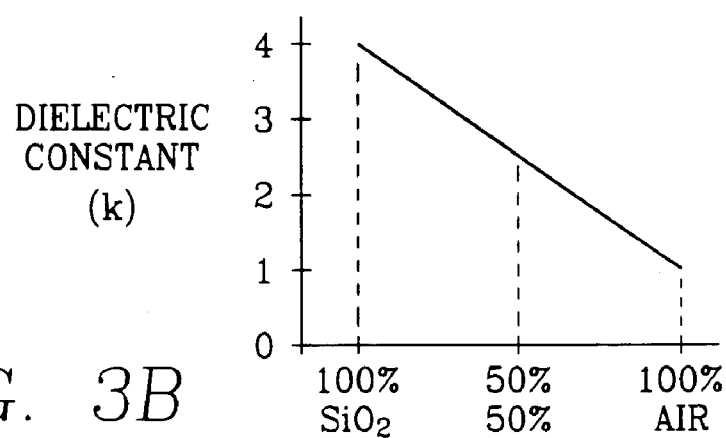
FIG. 3B is a graph showing the dependency of the material's dielectric constant (vertical axis) on the proportion of the dielectric material occupied by ion implanted gas bubbles.

Treatment of such a porous dielectric material can include the formation of gas bubbles as in the process depicted in FIG. 3A (to further reduce its dielectric constant), or the filling of pores with implanted gaseous species (to make it harder or stronger), as depicted in FIG. 13C. Alternatively, the same ion implantation step can accomplish both results, namely the formation of gas bubbles and the filling of pre-existing pores in the material. In conjunction with gas bubble-forming ion implantation in a porous material, a co-implantation step may performed as in FIG. 9 to enhance the properties of the gas bubbles. This co-implantation step is carried out in accordance with the description of FIG. 9, in which a material such as phosphorus, boron or Xe is ion implanted in the dielectric material. This co-implantation step may be carried out before, during or after the ion implantation of the bubble-forming gaseous species.

Ion implantation can reduce tensile stress in the film. This is accomplished through bond breaking within the film by the implanted ions. Making the film less tensile and more compressive reduces problems such as film flaking or delamination. Therefore, ion implantation of the gaseous species to enhance the material hardness can simultaneously reduce the tensile stress of the material. Reducing the tensile stress provides better adhesion of the treated film to underlying layers, making it more resistant to delamination. In one experiment, we have found that such ion implantation can increase the hardness by as much as 50% while changing the stress from tensile (e.g., at +80 megaPascals) to compressive (e.g., at −40 megaPascals). All this may be accomplished without increasing the dielectric constant of the treated layer. In fact, a slight improvement (decrease) in dielectric constant may be attained simultaneously with the foregoing improvements in hardness and stress.

Figure 14:
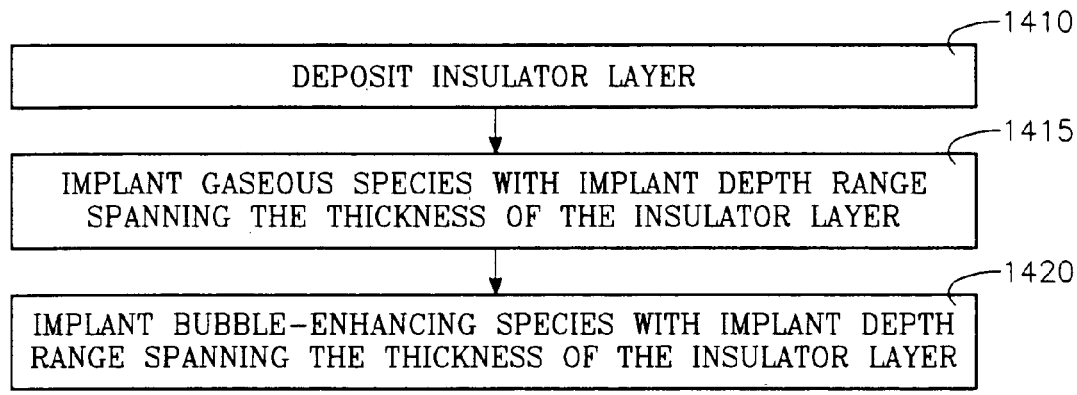
FIGS. 14, 15, 16 and 17 are flow diagrams illustrating different embodiments of a process of the invention.

FIG. 14 is a block flow diagram depicting a process sequence in accordance with an embodiment in which the dielectric layer is deposited and the bubble-forming implantation and bubble-enhancing implantation steps are performed at different times. Referring to FIG. 14, the first step is to deposit the dielectric layer (block 1410). This can be carried out by plasma enhanced chemical vapor deposition of silicon dioxide on a wafer in a plasma of silane and oxygen, for example. The next step (block 1415) is to ion implant a gaseous species (e.g., hydrogen or helium) into the dielectric layer formed in the previous step. Another step (block 1420) is to implant a bubble-enhancing species (e.g., boron or phosphorus) into the dielectric layer. The order in which the steps of implantation of the gaseous species of block 1415 and implantation of the bubble-enhancing species of block 1420 may be reversed from that illustrated in FIG. 14.

Figure 15:
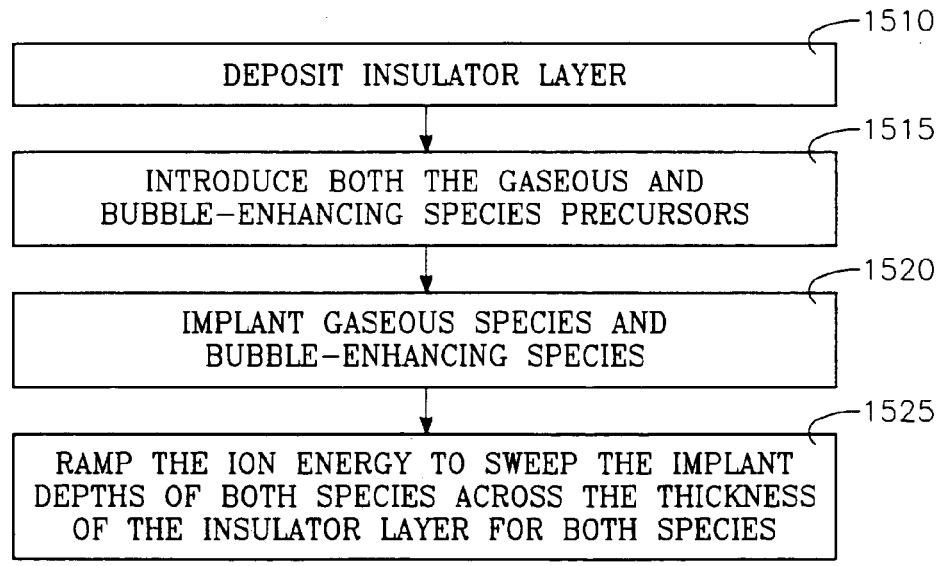

FIG. 15 is a block flow diagram depicting a process sequence in accordance with an embodiment in which gaseous bubble-forming species and the bubble-enhancing species are ion implanted in the dielectric layer simultaneously. In FIG. 15, the first step is to deposit a dielectric layer (block 1510). The next step is to introduce a process gas consisting of the gaseous bubble-forming species and a bubble-enhancing species into the plasma reactor chamber (block 1515). The next step is to ion implant both species (block 1520). The ion implantation depth profile of each species may be narrower than the thickness of the dielectric layer that is to be treated. Therefore, in the step of block 1525, the plasma bias power is changed or swept over a continuous range so that the ion implantation depth of each of the species is swept over a range corresponding to the thickness of the dielectric layer that is to be treated.

Figure 16:
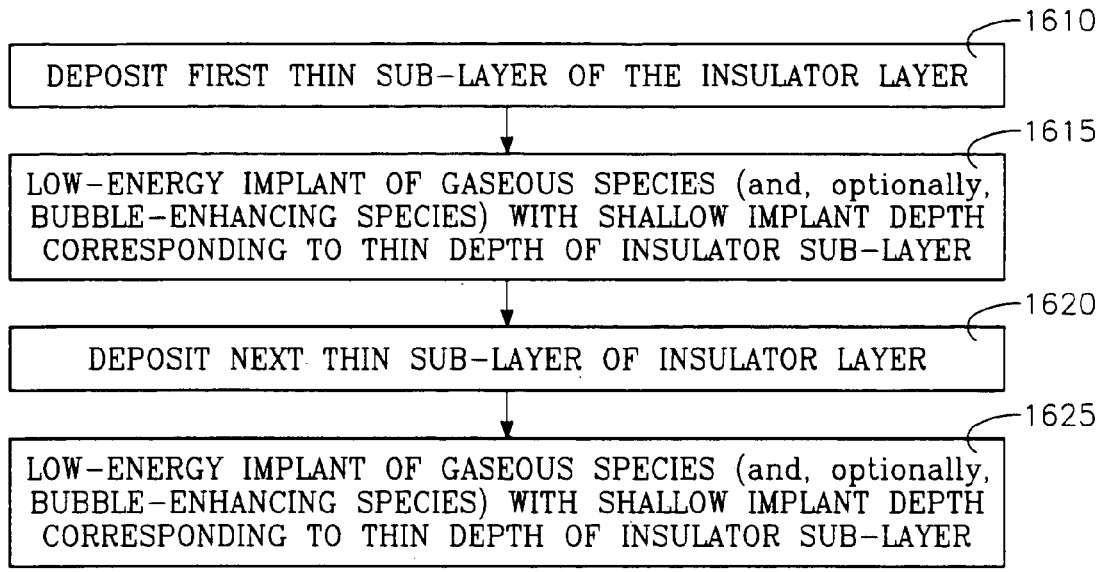

FIG. 16 is a block flow diagram depicting a process sequence in accordance with an embodiment in which the plasma bias power is minimized, making the ion implantation depth shallow, and thin successively deposited dielectric sub-layers are deposited and ion implanted in succession. The successive sub-layers can accumulate to form a thick dielectric layer. In this way, a very thick dielectric layer may be formed having ion implanted gas bubble-forming species using a very low ion energy (very shallow implant profile) to minimize the bubble size. Referring to FIG. 16, the first step is to deposit a thin sub-layer of dielectric material (block 1610). Next, a gas bubble-forming species, and optionally a bubble-enhancing species, are ion implanted into the thin dielectric sub-layer (block 1615). The next thin dielectric sub-layer is deposited over the preceding one (block 1620) and the ion implantation step is repeated (block 1625). The steps of 1620 and 1625 are repeated in successive cycles until the desired dielectric layer thickness has been attained. The result corresponds to the illustration of FIG. 10F.

Figure 17:
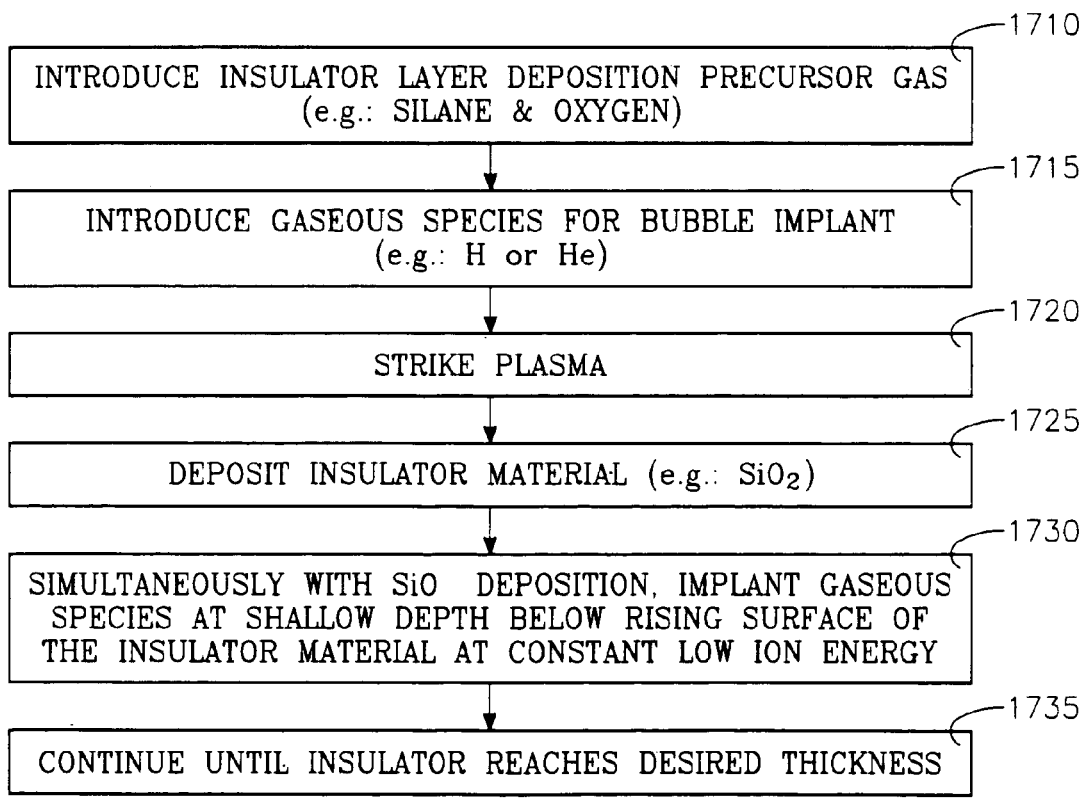

FIG. 17 illustrates another approach to minimizing ion implant energy where the final dielectric layer thickness exceeds the implant depth. The process of FIG. 17 corresponds to the method illustrated in FIGS. 12A–12E in which the dielectric layer deposition and the bubble-forming ion implantation are performed simultaneously. Referring to FIG. 17, the dielectric material precursor gases are introduced into the plasma reactor chamber (block 1710). These gases may be silane and oxygen, for example, if the dielectric layer is to be silicon dioxide. Also, the gaseous (bubble-forming) species is introduced along with (optionally) a bubble-enhancing species (block 1715). A plasma is maintained in the chamber (block 1720), so that the dielectric material is deposited (block 1725) while, simultaneously, the gaseous bubble-forming species (and, optionally, the bubble-enhancing species) are implanted below the ever-rising surface of the dielectric material (block 1730). The ion energy is such that the implant ion profile is concentrated near the ever-rising surface of the dielectric layer, so that as the layer grows it is implanted throughout its entire thickness. The process continues until the desired dielectric material thickness is attained (block 1735).

Enhancement of Film Properties by Ion Implantation:

Adhesion between films is enhanced by ion implantation. Kinetic energy of the incident ions moves a portion of the atoms in each of the adjacent layers across the boundary between the two layers. This increases the thickness of the boundary region (straddling the interface between the two layer) occupied by atoms of the two different layers, thereby increasing the number of bonds between atoms of the two different layers. The result is a stronger bond between the two layers. Such adhesion-enhancement can be obtained using any of the ion implantation processes described above in this specification. Such results are described in the above-referenced parent application with reference to FIGS. 118A through 118C and 119A through 119C. The overlying film may be a dielectric film formed on a metal film. The dielectric film may be a hard film such as SiO2, PSG or BSG, or it may be a porous film such as CSG.

The properties of a porous dielectric film such as CSG may be enhanced by ion implantation. As described above with reference to FIGS. 13A through 13C, the pores of a porous film such as CSG may be filled with a gas by ion implantation of one of the gaseous species referred to above in this specification. This process enhances the hardness of the film. Hardening occurs as a result of densification of the low K (dielectric constant) materials. Densification tends to increase K, but because gas bubble injection reduces K, the tendency of ion implantation to increase K is cancelled or reduced. As a result, hardening of the material can be carried out without increasing the dielectric constant of the material.

Another property of a porous dielectric film that may be enhanced by ion implantation is stress. Specifically, porous films tend to have relatively high tensile stress, and as a result are susceptible to flaking and delamination. Ion implantation tends to break a small proportion of the atomic bonds within the porous layer, which changes the stress within the layer from tensile to compressive. The transition reduces the porous film's susceptibility to flaking or delamination.

The ion implantation process for improving the mechanical properties of a porous dielectric layer, (e.g., by increasing its hardness or reducing its tensile stress), has been described with reference to ion implantation of a gaseous species such as hydrogen, nitrogen or one of the inert gas species. However, a non-gaseous species may be employed in such a process. The non-gaseous species is preferably a process-compatible semiconductor species, such as (for example) germanium, silicon, carbon, or non-conductor species such as (for example) boron, arsenic, phosphorus, and the like. The entire process consists of, first, obtaining a dielectric layer that has been doped so as to reduce its dielectric constant. This may be accomplished, for example, by forming a silicon dioxide layer doped with carbon, using chemical vapor deposition or other suitable techniques. Such a low-K material tends to be porous and tends to have significant tensile stress. Then, the hardness of the material is improved and the tensile stress of the material is reduced by ion implanting one of the non-gaseous species listed immediately above.

Formation of a porous low-dielectric constant material (such as carbon-doped silicon dioxide) and enhancing the hardness of that material can be accomplished simultaneously in a single ion implantation step. First, a pure (or nearly pure) dielectric layer (such as silicon dioxide) is deposited using a process such as plasma enhanced chemical vapor deposition. Then, using plasma immersion ion implantation of the type described above, the dielectric layer (e.g., SiO2) is implanted with a first species (e.g., carbon) that reduces its dielectric constant and simultaneously implanted with a second species (e.g., hydrogen) that improves its mechanical properties (increasing hardness and reducing tensile stress). Such a simultaneous ion implantation process may be carried out by plasma immersion ion implantation using a process gas whose constituents are the first and second species. Ion implantation of the first species (e.g., carbon) reduces the dielectric constant through changes in the chemical properties of the dielectric material, while ion implantation of the second species (e.g., hydrogen) changes the material through mechanical changes in the dielectric material (e.g., the filling of voids with the second species). Such a process gas may contain carbon and hydrogen as the first and second species, respectively (in which case the process gas could be methane or acetylene). The first species may be another species such as boron, for example, so that the process gas could consist of boron and hydrogen (B2H6), for example. The dielectric material that is treated in this manner may be silicon dioxide or silicon nitride, for example. Moreover, as discussed in the preceding paragraph, the second species that enhances the mechanical properties of the dielectric layer may be a non-gaseous species of the type listed above (germanium, silicon, carbon, boron, arsenic, phosphorus, and the like). This ion implantation process may be followed immediately by a post-implant annealing step in which the wafer temperature is raised to an elevated temperature less than about 400 degrees C. It is believed that such an elevated temperature promotes the formation of the optimum molecular species for reducing the dielectric constant K of the implanted dielectric material.

Each of the ion implantation steps described above may be followed by post-implant annealing at temperatures less than 400 degrees C. to stabilize the effects of ion implantation. Such temperatures do not distort the process because in standard integration thermal processes, such temperatures are used for various processes such as CVD film deposition. Post-implant annealing, however, is not needed if the ion implantation is performed at a high wafer temperature (e.g., above 500 degrees C.). When such post-implant annealing is performed immediately following an implantation process for reducing tensile stress (described above in this specification), a slight penalty is incurred because the tensile stress increases (slightly). In one example, this increase was from −40 megaPascal to −10 megaPascal, which nevertheless left a great improvement from the pre-implant stress level of the material (+80 megaPascal).

While the invention has been described in detail by specific reference to preferred embodiments, it is understood that variations and modifications thereof may be made without departing from the true spirit and scope of the invention.

What is claimed is:

1. A method of forming a low dielectric constant insulating film on a workpiece, comprising:
    forming a dielectric layer on said workpiece; and ion implanting a gaseous species into said dielectric layer so as to form gas bubbles in said dielectric layer;
    regulating the average diameter of said gas bubbles by regulating the energy of the ions of said gaseous species during the step of ion implanting.

2. A method of forming a low dielectric constant insulating film on a workpiece, comprising:
    forming a dielectric layer on said workpiece; and
    ion implanting a gaseous species into said dielectric layer so as to form gas bubbles in said dielectric layer;
    regulating the average diameter of said gas bubbles by regulating the temperature of said workpiece during the ion implanting step.

3. A method of forming a low dielectric constant insulating film on a workpiece, comprising:
    forming a dielectric layer on said workpiece; and
    ion implanting a gaseous species into said dielectric layer so as to form gas bubbles in said dielectric layer;
    regulating the average diameter of said bubbles by regulating the ion implantation dose of the ion implantation step.

4. A method of forming a low dielectric constant insulating film on a workpiece, comprising:
    forming a dielectric layer on said workpiece; and
    ion implanting a gaseous species into said dielectric layer so as to form gas bubbles in said dielectric layer;
    regulating the average diameter of said bubbles by ion implanting a bubble-enhancing species.

5. The method of claim 4 wherein said bubble-enhancing species comprises one of boron, phosphorus, arsenic, carbon, germanium.

6. The method of claim 5 wherein said gaseous species comprises one or combination of hydrogen, helium, nitrogen, argon, xenon, neon, krypton, fluorine, chlorine, iodine, bromine, oxygen.

7. A method of forming a low dielectric constant insulating film on a workpiece, comprising:
forming a dielectric layer on said workpiece; and
ion implanting a gaseous species into said dielectric layer so as to form gas bubbles in said dielectric layer;
causing the gas in said bubbles to evolve from said bubbles so that each bubble contains a vacuum.

8. The method of claim 7 wherein the step of causing the gas to evolve from the bubbles comprises performing a post-implantation anneal step.

9. A method of forming a low dielectric constant insulating film on a workpiece, comprising:
forming a dielectric layer on said workpiece;
ion implanting a gaseous species into said dielectric layer so as to form gas bubbles in said dielectric layer wherein the step of ion implanting comprises:
placing said workpiece in a vacuum chamber having at least one external reentrant conduit;
introducing a process gas comprising a precursor of the gaseous species to be ion implanted; and
coupling RF power to process gases in said reentrant conduit to generate an oscillating plasma current in a torroidal path that includes said reentrant conduit and a process zone adjacent the surface of the workpiece.

10. The method of claim 9 further comprising applying RF plasma bias power to said workpiece.

11. The method of claim 9 wherein said process gas further comprises a bubble-enhancing species.

12. The method of claim 9 wherein said precursor comprises a molecular form of said gaseous species.

13. The method of claim 9 wherein said process gas further comprises a bubble-enhancing species.

14. The method of claim 13 wherein said bubble-enhancing species tends to limit the average size of said gas bubbles.

15. The method of claim 13 wherein said bubble-enhancing species tends to improve the stability of said gas bubbles.

16. The method of claim 13 wherein said bubble-enhancing species comprises one of boron, phosphorus, arsenic, carbon, germanium.

17. The method of claim 1 wherein the step of forming a dielectric layer and the step of ion implanting are carried out contemporaneously.

18. The method of claim 9 wherein the step of forming a dielectric layer and the step of ion implanting are carried out contemporaneously, and wherein said process gas further comprises a precursor of the dielectric material of said dielectric layer.

19. The method of claim 18 wherein said precursor of said dielectric material is a gas mixture comprising silane and oxygen or SiF4 and oxygen.

20. The method of claim 18 wherein said precursor of said dielectric material is a gas mixture comprising silane and nitrogen, or silane and oxygen.

21. The method of claim 18 further comprising applying an RF bias voltage to said workpiece corresponding to an implant depth profile relative to a top surface of said dielectric layer that is less than the final thickness of said dielectric layer.

22. The method of claim 21 wherein the top surface of said dielectric layer rises during the contemporaneous deposition and implantation steps, whereby said implant depth profile rises contemporaneously.

23. The method of claim 2 wherein:
said ion energy corresponds to a shallow ion implantation depth profile relative to a desired final thickness of said dielectric layer;
the step of depositing a dielectric layer deposits a thin dielectric layer corresponding to said shallow ion implantation depth profile whereby to implant substantially the entire thin dielectric layer; and
the steps of depositing and implanting are repeated in alternating sequence to form a stack of thin dielectric layers each ion implanted with the gaseous species to form gas bubbles therein.

24. A method of forming a thin film on a semiconductor structure with enhanced adhesion, comprising:
depositing an overlying dielectric film on an underlying layer of a semiconductor structure; and
performing plasma immersion ion implantation on said semiconductor structure to form a boundary layer at the interface between the dielectric film and the underlying layer containing atoms from both said dielectric layer and said underlying layer.

25. A method of forming a porous dielectric film of a semiconductor structure with enhanced hardness of the porous dielectric film, comprising:
depositing an overlying porous dielectric film on an underlying layer of a semiconductor structure; and
performing plasma immersion ion implantation of a gaseous species on said semiconductor structure to fill pores of said porous film with gas.

26. A method of forming a porous dielectric film on a semiconductor structure having reduced tensile stress, comprising:
depositing an overlying porous dielectric film on an underlying layer of a semiconductor structure; and
performing plasma immersion ion implantation on said semiconductor structure to break atomic bonds within said porous film.

27. A method of forming a porous dielectric film on an underlying layer of a semiconductor structure having enhanced adhesion with the underlying layer, reduced tensile stress and enhanced hardness, comprising:
depositing an overlying porous dielectric film on an underlying layer of a semiconductor structure; and
performing plasma immersion ion implantation on said semiconductor structure of a gaseous species to break atomic bonds within said porous film, to form a boundary layer at the interface between the dielectric film and the underlying layer containing atoms from both said dielectric layer and said underlying layer, and to fill pores of said porous film with gas.

28. A method of forming a dielectric film on an underlying layer of a semiconductor structure having reduced dielectric constant, reduced tensile stress and enhanced hardness, comprising:
depositing an overlying dielectric film on an underlying layer of a semiconductor structure, and doping the dielectric film with a first species that reduces the dielectric constant of the dielectric film; and
increasing the hardness of said dielectric film by ion implanting a second species into said dielectric film.

29. The method of claim 28 wherein the step of doping said dielectric film creates pores in said dielectric film and wherein the step of ion implanting said second species breaks said pores into smaller pores with said second species.

30. The method of claim 28 wherein said first species comprises one of (a) a semiconductor species, (b) a non-conductor species.

31. : The method of claim 30 wherein said second species comprises a gaseous species.

32. The method of claim 30 wherein said second species comprises a non-gaseous species that is one of (a) a semiconductor species, (b) a non-conductor species.

33. A method of forming a dielectric film on an underlying layer of a semiconductor structure having reduced dielectric constant, reduced tensile stress and enhanced hardness, comprising:
  depositing an overlying dielectric film on an underlying layer of a semiconductor structure; and
  decreasing the dielectric constant of said dielectric film by ion implanting a first species into said dielectric film so as to dope said dielectric film with said first species, while simultaneously enhancing the hardness of the doped dielectric film by ion implanting a second species into said dielectric film.

34. The method of claim 33 wherein said first species comprises one of (a) a semiconductor species, (b) a non-conductor species.

35. The method of claim 34 wherein said second species comprises a gaseous species.

36. The method of claim 34 wherein said second species comprises a non-gaseous species that is one of (a) a semiconductor species, (b) a nonconductor species.

37. The method of claim 1 wherein the step of ion implanting is a carried out by plasma immersion ion implantation.

38. The method of claim 37 wherein the step of plasma immersion ion implantation is carried out in a chamber having an external reentrant conduit completing a toroidal path extending through a plasma process zone of the chamber and generating an oscillating RE plasma current in the toroidal path.

* * * * *